(12) United States Patent
Gupta et al.

(10) Patent No.: US 7,033,168 B1
(45) Date of Patent: Apr. 25, 2006

(54) SEMICONDUCTOR WAFER BOAT FOR A VERTICAL FURNACE

(75) Inventors: Puneet Gupta, St. Louis, MO (US); Larry W. Shive, St. Charles, MO (US); Brian L. Gilmore, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 11/041,593

(22) Filed: Jan. 24, 2005

(51) Int. Cl.
*F27D 5/00* (2006.01)
(52) U.S. Cl. .................................. 432/253; 211/41.18
(58) Field of Classification Search ............... 432/253, 432/258, 259; 211/41.18
See application file for complete search history.

(56) References Cited

U.S. PATENT DOCUMENTS

| | | | |
|---|---|---|---|
| 5,820,367 A * | 10/1998 | Osawa | 432/253 |
| 6,056,123 A | 5/2000 | Niemirowski et al. | |
| 6,095,806 A | 8/2000 | Suzuki et al. | |
| 6,287,112 B1 | 9/2001 | Van Voorst Vader et al. | |
| 6,474,987 B1 * | 11/2002 | Nakai et al. | 432/258 |
| 6,488,497 B1 | 12/2002 | Buckley et al. | |
| 6,716,027 B1 * | 4/2004 | Kim et al. | 432/253 |
| 6,796,439 B1 * | 9/2004 | Araki | 211/41.18 |

FOREIGN PATENT DOCUMENTS

| | | |
|---|---|---|
| JP | 06333865 A | 12/1994 |
| JP | 2000021958 A | 1/2000 |
| JP | 2000127020 A | 5/2000 |
| JP | 2000164522 A | 6/2000 |
| JP | 2000208428 A | 7/2000 |
| JP | 2000232151 A | 8/2000 |
| JP | 2001102318 A | 4/2001 |
| JP | 2002093731 A | 3/2002 |
| JP | 2003258064 A | 9/2003 |
| JP | 2004014985 A | 1/2004 |

* cited by examiner

*Primary Examiner*—Gregory A. Wilson
(74) *Attorney, Agent, or Firm*—Senniger Powers (57) ABSTRACT

A wafer boat for use in heat treatment of semiconductor wafers in a vertical furnace comprises support rods extending generally vertically when the wafer boat is placed in the vertical furnace. Fingers are supported by and extend along vertical extent of the support rods. Wafer holder platforms are adapted to be supported by groups of fingers lying in generally different common horizontal planes. The fingers are adapted to underlie the wafer holder platforms and support the platforms at the support locations. The fingers and wafer holder platforms each have a respective first overall maximum thickness. The support location of at least one of the fingers and the wafer holder platforms have a second maximum thickness less than the first overall maximum thickness.

20 Claims, 10 Drawing Sheets

SEMICONDUCTOR WAFER BOAT FOR A VERTICAL FURNACE

BACKGROUND OF THE INVENTION

This invention relates generally to a semiconductor wafer boat, and more particularly, to an improved semiconductor wafer boat for use in heat treatment of semiconductor wafers in a vertical furnace.

High temperature heat-treatment (annealing) of semiconductor wafers is commonly used to achieve certain desirable characteristics. For example, such a process may be used to create a defect free layer of silicon on the wafers. The high temperature annealing process of the type to which the present invention particularly relates is carried out in a vertical furnace which preferably subjects the wafers to temperatures above 1100 degrees C., and more preferably between about 1200 degrees C. and about 1300 degrees C.

During high temperature heat-treatment, at temperatures above 750 C and especially above 1100 C, the silicon wafers become more plastic. If the silicon wafers are not adequately supported during heat treatment, the wafers may undergo slip due to local gravitational and thermal stresses. As is well known in the art, slip may introduce contaminants into the device areas of the wafers. Moreover, excessive slip may lead to plastic deformation of the wafers, which in turn may lead to production problems, such as photolithography overlay failures causing yield losses in device manufacture.

Vertical wafer boats are used to adequately support semiconductor wafers, much like a rack, and, ideally, to minimize the local gravitational and thermal stresses on the wafers to avoid slip and plastic deformation while the wafers are being heat treated. A typical vertical wafer boat used in a vertical furnace comprises three or more vertical rails also referred to as rods. The rods typically have grooves or laterally extending fingers for supporting the wafers between the vertical rods within the boat. Each wafer may rest directly on fingers (or grooves) lying generally in a common horizontal plane. This configuration is common in the older art and is adequate when heat treating 200 mm and smaller diameter wafers. Alternatively, each wafer may rest on a wafer holder platform, e.g., a ring or solid plate, supported by the fingers (or in grooves), lying generally in a common horizontal plane. This configuration is common in the newer art and is usually necessary to adequately support 300 mm and larger diameter wafers. The 300 mm and larger diameter wafers are subjected to more local gravitational and thermal stresses than smaller diameter wafers, and the wafer holder platforms better support the 300 mm wafers by increasing the areas of the wafers that are supported.

Even with the use of wafer holder platforms, however, the 300 mm wafers may undergo slip and plastic deformation if the fingers and wafer holder platforms are not properly constructed. The fingers and the wafer holder platforms are subjected to local gravitational and thermal stresses in the furnace, just like the wafers. Unless the fingers and wafer holder platforms remain mechanically stable during heat treatment, they may undergo plastic deformation causing the wafers to undergo slip possibly leading to plastic deformation. The thickness of each finger and the thickness of each wafer holder platform correlate to the mechanical stability of the finger and wafer holder platform (i.e., the thicker the finger and the platform, the more mechanically stable they are). However, increasing the thickness of each finger and the thickness of each wafer holder platform decreases the number of wafers the boat can hold because of dimensional constraints imposed on the boat. For example, the wafer boat must have a height that fits within a vertical furnace and the wafers must be spaced apart in the boat a certain distance to allow a robotic arm to introduce and remove the wafers and wafer holder platforms. Increasing the thickness of each finger and the thickness of each wafer holder platform decreases the amount of vertical space available for the wafers. Additionally, thicker fingers and wafer holder platforms increase the thermal mass of the wafer boat which can also be detrimental to the slip performance of the boat. This is because of the possible increased stresses on the wafers resulting from higher thermal gradients that arise as a direct consequence of higher thermal mass. In general, the negative effects of increased thermal mass due to larger thicknesses of the fingers and wafer holder platforms can be overcome by reducing the temperature ramp rate during the annealing cycle.

Moreover, the wafer holder platforms must be properly supported by the fingers during heat treatment to substantially preclude plastic deformation in the platforms. In addition to the thickness of each finger, the positions of the fingers relative to the wafers correlate to the probability of plastic deformation of the wafer holder platforms. However, the positions of the fingers relative to the wafers are constrained by dimensional constraints of the boat. For example, the cross-section diameter of the boat must be such that the boat can fit within a furnace and at least two rods of the boat must be spaced apart a distance that allows a wafer, e.g., a 300 mm wafer, or wafer holder platform to be received between them.

With the thickness of each finger, the thickness of each wafer holder platform, and the positions of the fingers relative to the wafers constrained by the dimensions of the boat, the teachings of the prior art permit an adequately performing boat utilizing wafer holder platforms to hold up to about 90 wafers. Increasing the number of wafers that a wafer boat can hold and support without causing unsatisfactory slip and possibly plastic deformation in the wafers would increase the throughput of the furnace and reduce the cost of heat treatment per wafer.

SUMMARY OF THE INVENTION

In one aspect of the present invention, a wafer boat for use in heat treatment of semiconductor wafers in a vertical furnace generally comprises support rods disposed in fixed arrangement relative to each other. The support rods extend vertically when the wafer boat is placed in the vertical furnace. Fingers are supported by the support rods and extend from the rods. The fingers are arranged in groups lying generally in different common horizontal planes along the vertical extent of the support rods. Wafer holder platforms are adapted to be supported by respective groups of fingers generally at different ones of the horizontal planes. The fingers are adapted to underlie the wafer holder platforms and support the platforms at support locations. The wafer holder platforms are sized and shaped for receiving one of the semiconductor wafers thereon. The fingers and the wafer holder platforms each have a respective first overall maximum thickness. The support location of each of at least one of the fingers and the wafer holder platforms has a second maximum thickness less than the first overall maximum thickness.

In another aspect of the present invention, a wafer boat for use in heat treatment of semiconductor wafers having a nominal diameter in a vertical furnace generally comprises support rods disposed in a fixed arrangement relative to each other and extending generally vertically when the wafer boat is placed in the vertical furnace. The support rods include a pair of forward rods and at least one other rod. Fingers are supported by the support rods and extend from the rods. The fingers are arranged in groups lying generally in different common horizontal planes along the vertical extent of the support rods. The forward rods lie generally in a vertical plane, and the finger extending from the forward rods makes an angle with the vertical plane of the forward rods. Wafer holder platforms are adapted to be supported by respective groups of fingers generally at different ones of said horizontal planes. The fingers are adapted to underlie the wafer holder platforms and support the platforms at support locations. The wafer holder platforms are sized and shaped for receiving one of the semiconductor wafer thereon. The two forward rods are located in a vertical plane which is spaced forward of a parallel vertical plane tangent to the wafer boat a distance greater than 50% of a nominal diameter of the semiconductor wafers to be held in the wafer boat and less than about 85% of the nominal diameter of the semiconductor wafers.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENT

Figure 1:
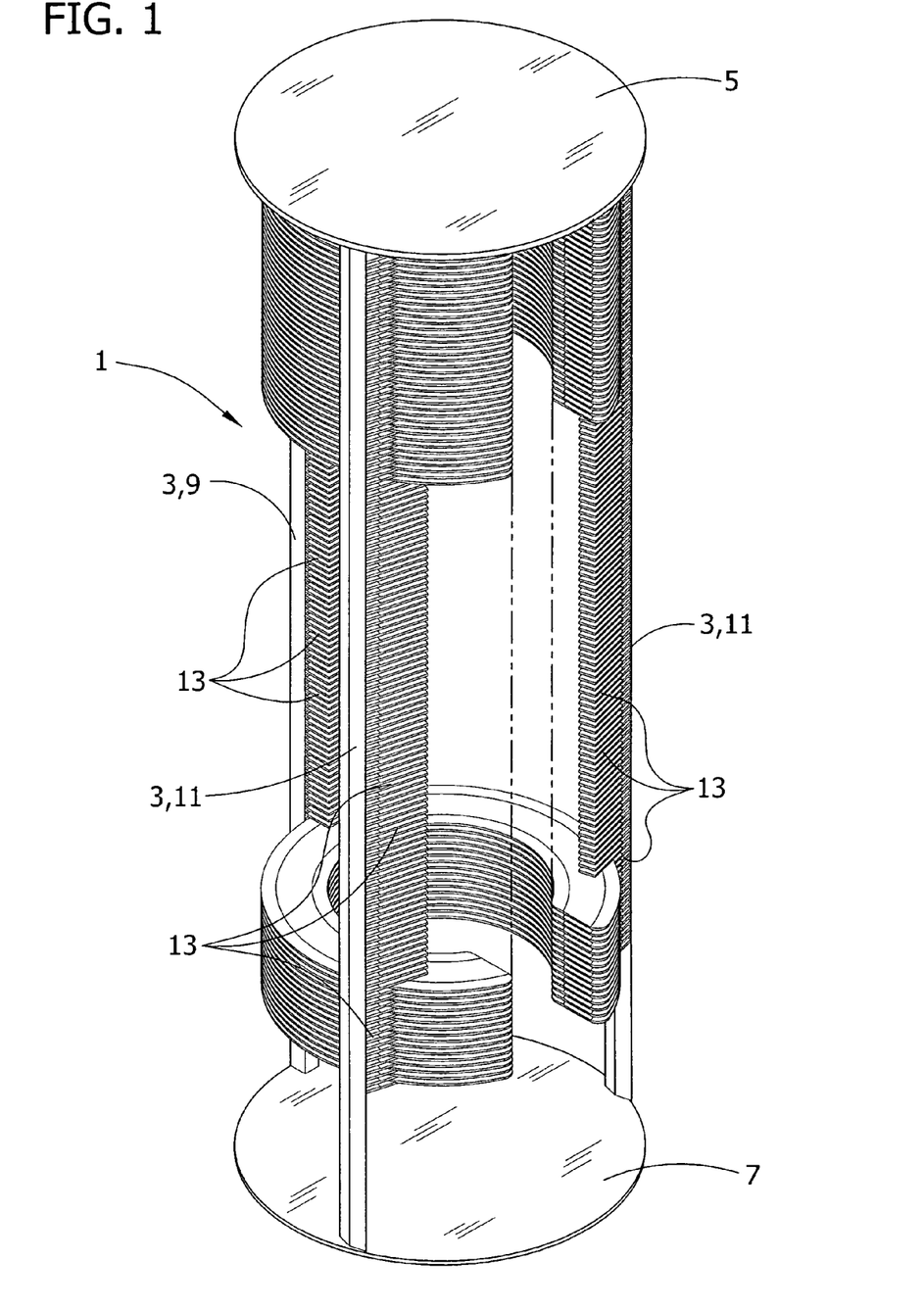
FIG. 1 is a perspective of a wafer boat having wafer holder platforms resting on fingers extending from rods.
Figure 2:
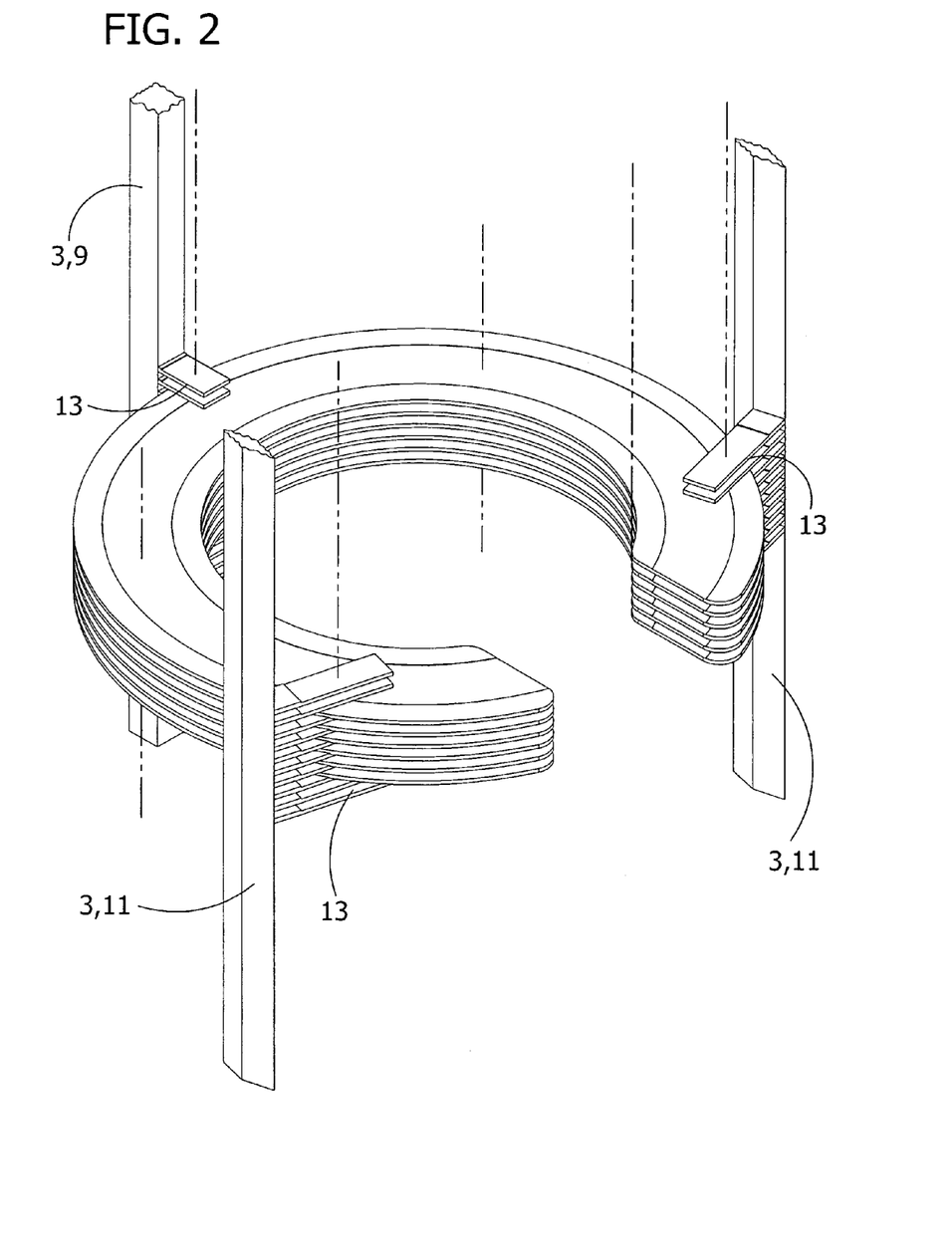
FIG. 2 is an enlarged fragmentary perspective of the wafer boat.

Referring now to the drawings and in particular to FIG. 1 which illustrates a semiconductor wafer boat, indicated generally at 1, constructed according to the principles of the present invention. The wafer boat 1 includes spaced-apart support rods 3 that are affixed to a top 5 and a base 7 of the boat to retain the positions of the rods relative to each other. When the wafer boat 1 is placed in a vertical furnace, the support rods 3 are generally vertical. In the illustrated embodiment, the wafer boat 1 has a central rod 9 and two forward rods 11.

The support rods 3 support laterally extending fingers 13. The fingers 13 may be integrally formed on the support rods 3. For example, cuts may be made in an elongate one-piece structure, forming the fingers 13. The fingers 13 of the wafer boat 1 are arranged in groups lying in different common generally horizontal planes along the vertical extent of the support rods 3.

Figure 3:
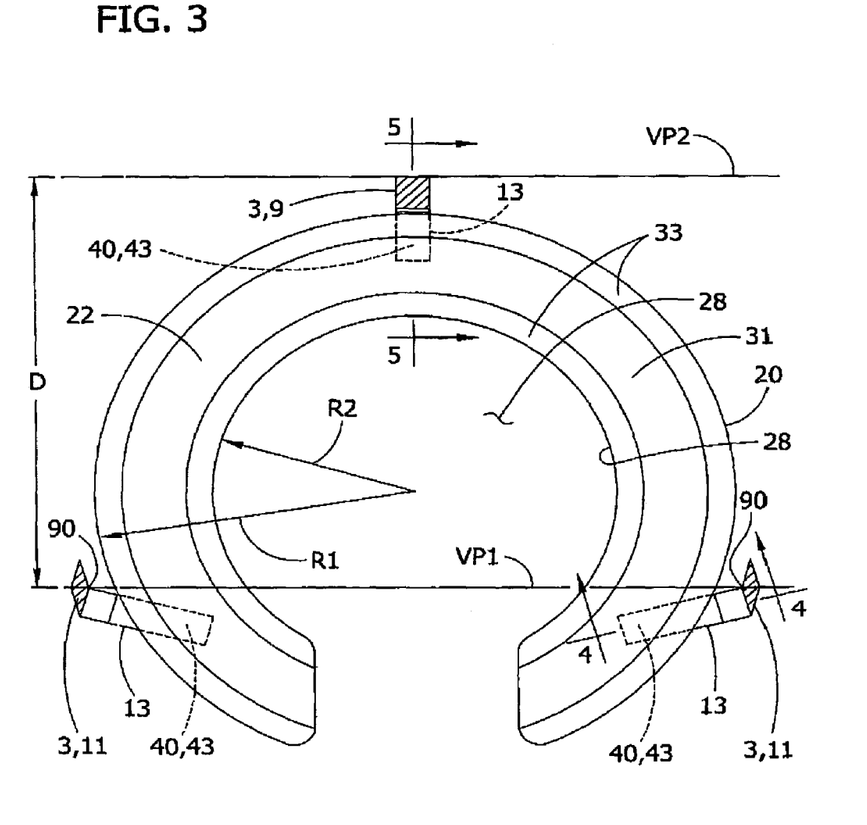
FIG. 3 is a horizontal cross-section of the wafer boat showing the fingers in a common horizontal plane supporting one wafer holder platform.

Referring to FIG. 3, the fingers 13 that lie in a same generally horizontal plane engage and support a same wafer holder platform 20. The illustrated wafer holder platforms 20 are of an open-ring type. The open-ring type platform has top and bottom surfaces designated 22 and 24 (FIG. 6), respectively, an outer radius R1, and a hole 28 generally in the center portion of the disk having a radial opening extending from the hole to the outer periphery of the platform 20. Other types of wafer platforms, including a closed-ring type and a solid plate, are within the scope of this invention. For a wafer platform used to support 300 mm wafers, the radius R1 is about 150 mm, and a radius R2 of the hole 28 is about 95 mm. In the illustrated embodiment, the wafer holder platforms 20 have an arcuate groove 31 in the top surface 22. The groove is preferably between about 0.2 mm and about 0.5 mm deep. The groove 31 defines a pair of spaced apart plateaus 33 on opposite sides of the groove. The plateaus 33 directly support a semiconductor wafer while the wafer rests on the wafer holder platform 20. By resting on the plateaus 33 and over the groove 31, the wafer can be removed from the wafer holder platform without the wafer sticking to the wafer holder platform, as is well known in the art. It will be understood that constructions (not shown) other than the groove 31 can be used within the scope of the present invention. For instance, multiple grooves having different depths, or holes through the platform 20 could be used in plate of any groove(s).

The entire wafer boat 1 can be made of quartz. More preferably, the boat 1 is made of a silicon carbide material, which is more mechanically stable and chemically inert than quartz when subjected to high temperatures. Making the boat 1 of a silicon material reduces contamination of semiconductor wafers, as is well known in the art.

Figure 4:
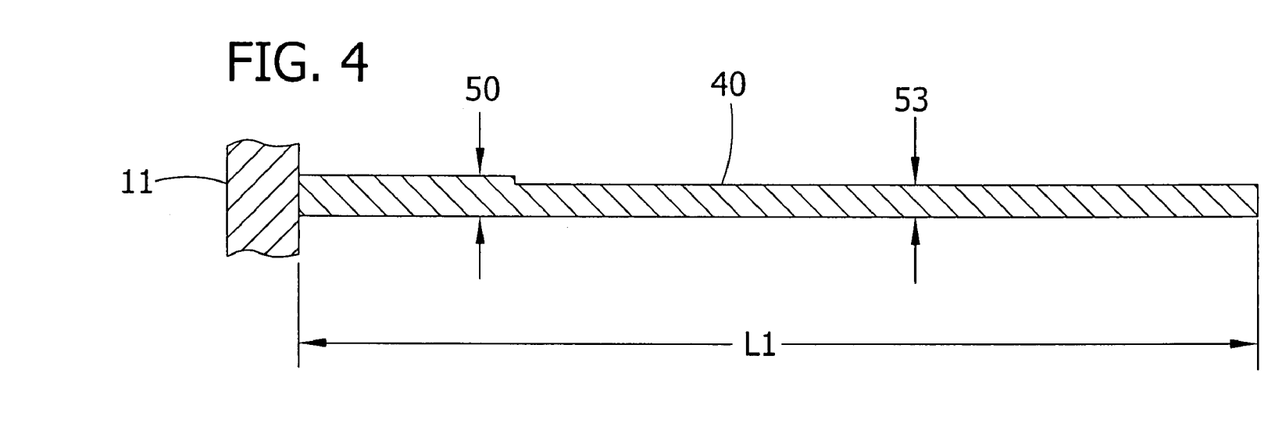
FIG. 4 is a fragmentary section taken in plane including line 4—4 of FIG. 3 showing a single finger but with the platform removed.
Figure 5:
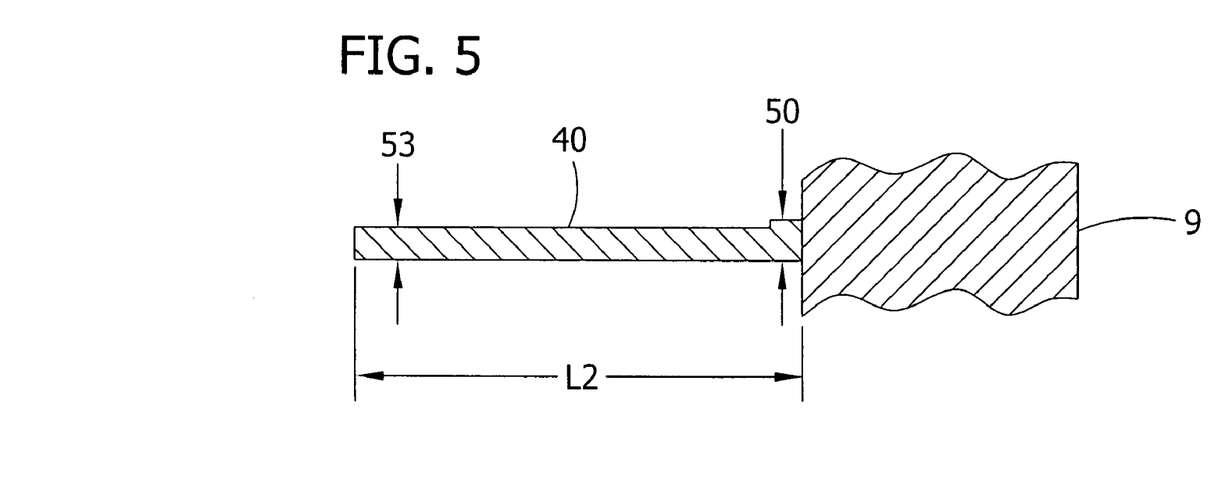
FIG. 5 is a fragmentary section taken in the plane including line 5—5 of FIG. 3 showing a single finger with the platform removed.
Figure 6:
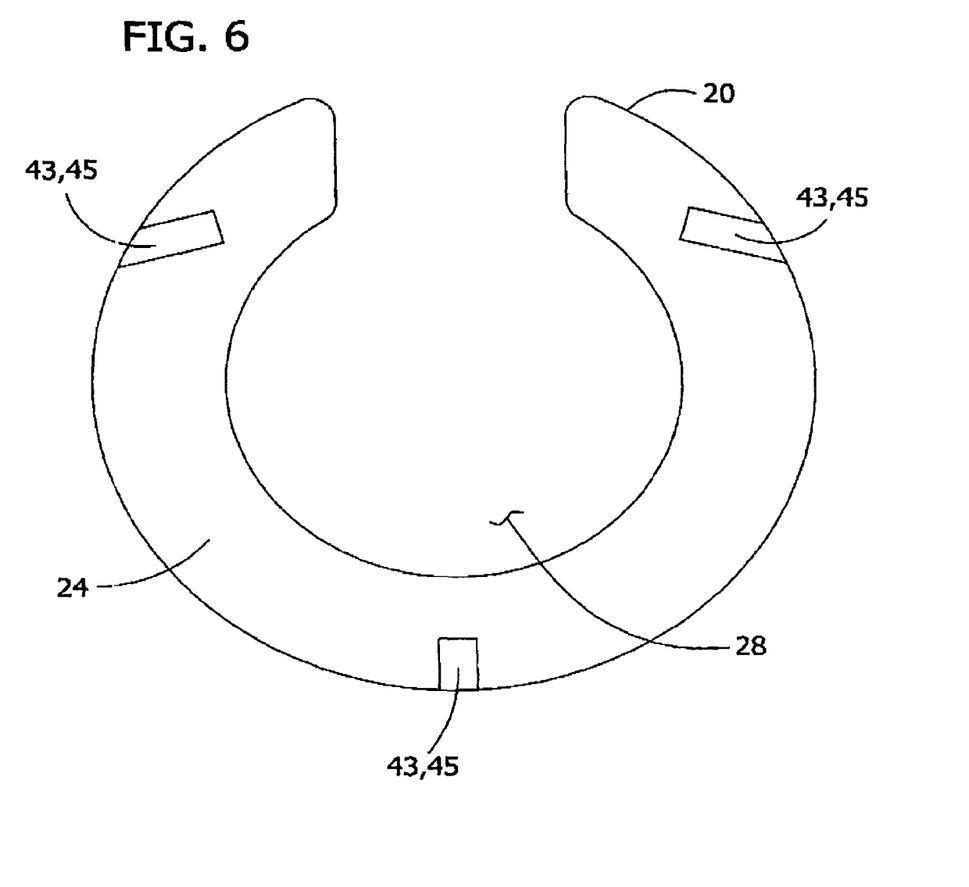
FIG. 6 is a bottom plan view of one wafer holder platform.
Figure 7:
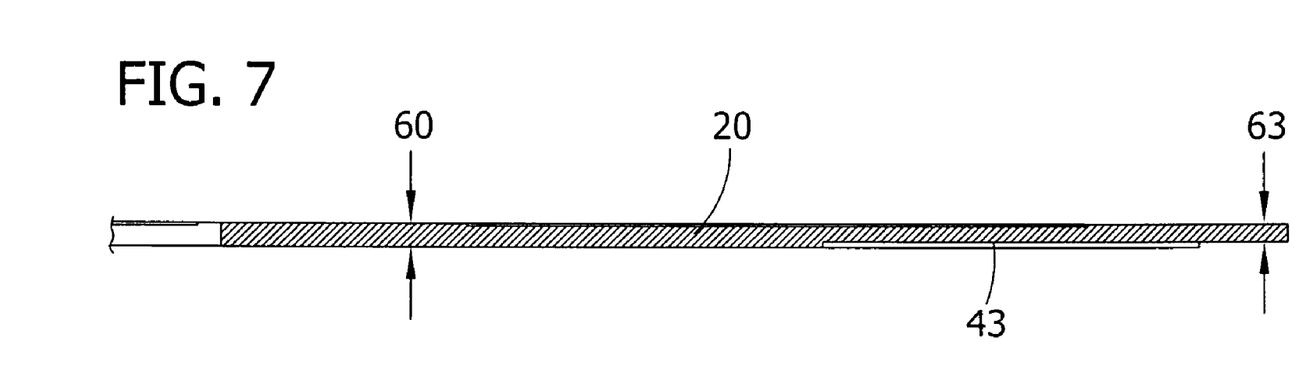
FIG. 7 is a fragmentary section taken in the plane including line 4—4 of FIG. 3 showing the platform with the finger removed.
Figure 8:
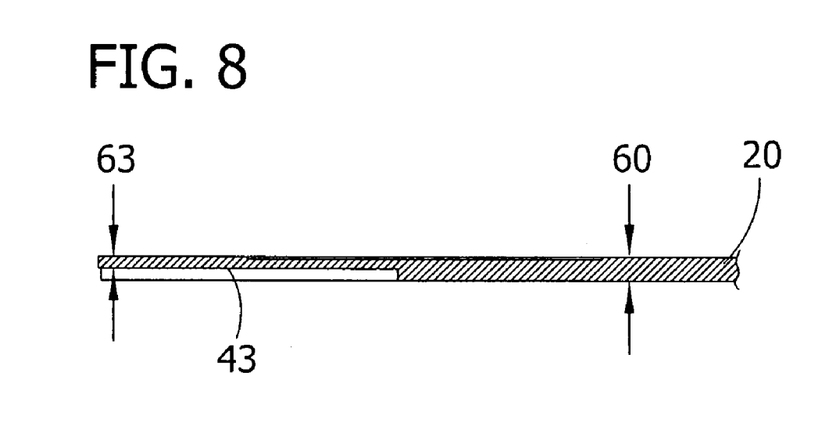
FIG. 8 is a fragmentary section taken in the plane including line 5—5 of FIG. 3 showing the platform with the finger removed.

Referring now to FIGS. 4–10, each finger 13 of the wafer boat 1 has a support location 40 that engages and supports one of the wafer holder platforms 20 (FIGS. 4 and 5). Similarly, each wafer holder platform 20 has three support locations 43 that engage and are supported by the group of fingers 13 lying in the common horizontal plane (FIGS. 6–10). Each support location 40 of the fingers 13 is adapted to underlie the wafer holder platform 20 at the respective support location 43 of the wafer platform (FIGS. 7 and 8). Similarly, each support location 43 of the wafer holder platforms 20 is adapted to overlie the respective support location 40 of the respective finger 13.

Referring particularly to FIGS. 4 and 5, each finger 13 has a non-uniform thickness along its length L, such that each finger has a first overall maximum thickness 50 which is greater than a second maximum thickness 53. The first overall maximum thickness 50 is the thickest part of the entire finger 13. In one embodiment, the first overall maximum thickness 50 is at least about 2.0 mm, and in the illustrated embodiment is about 2.5 mm. The second maximum thickness 53 of the finger is the maximum thickness of the finger 13 within the boundaries of the support location 40. In the illustrated embodiment, the support location 40 and the second overall maximum thickness 53 of the finger 13 are located at the free end of the finger. The second maximum thickness 53 of the fingers 13 is at least about 0.5 mm, and in the illustrated embodiment is about 2.0 mm. The illustrated dimensions of the wafer boat 1 and its components (given above and hereinafter) are the preferred dimensions for constructing a wafer boat for use in high-temperature heat treatment of 300 mm diameter silicon wafers in a vertical furnace. Other dimensions may be used within the scope of the present invention.

Referring particularly to FIGS. 7 and 8, each wafer holder platform 20 (like each finger 13) has a non-uniform thickness such that each platform has a first overall maximum thickness 60 that is the largest thickness dimension of the entire wafer holder platform. Preferably, the first overall maximum thickness 60 is at least about 2.0 mm, and in the illustrated embodiment is about 2.0 mm. The wafer holder platform 20 has a second maximum thickness 63 at each support location 43 that is less than the first maximum thickness 60 of the wafer holder platform. In the illustrated embodiment, the wafer holder platform 20 has grooves 45 in its bottom surface 24 that correspond to the support locations 43 of the wafer holder platform (FIG. 6). The second maximum thickness is at least about 0.5 mm, and in the illustrated embodiment is about 1.0 mm.

Figure 9:
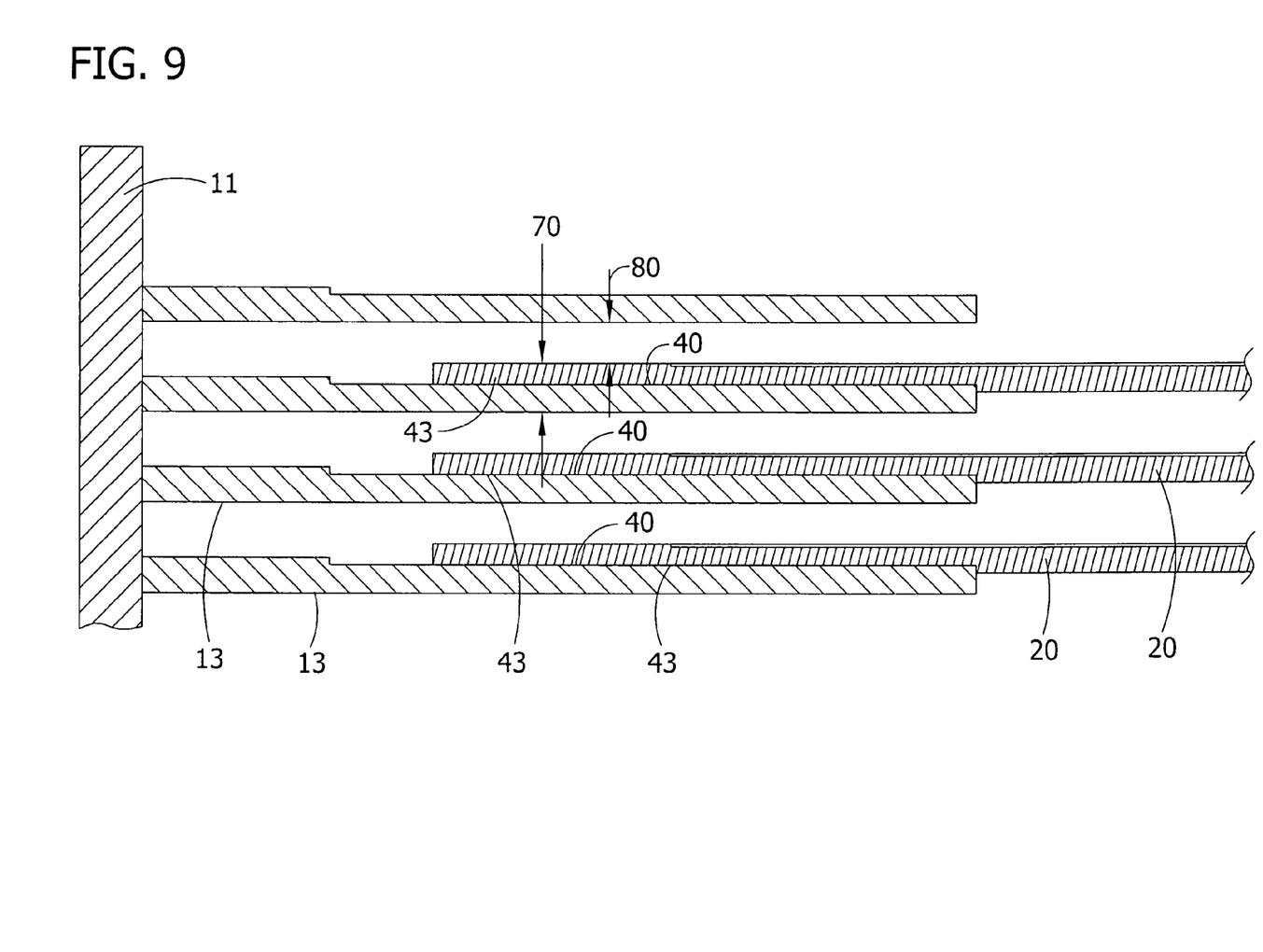
FIG. 9 is a fragmentary section similar to FIG. 5, but showing multiple fingers and platforms.
Figure 10:
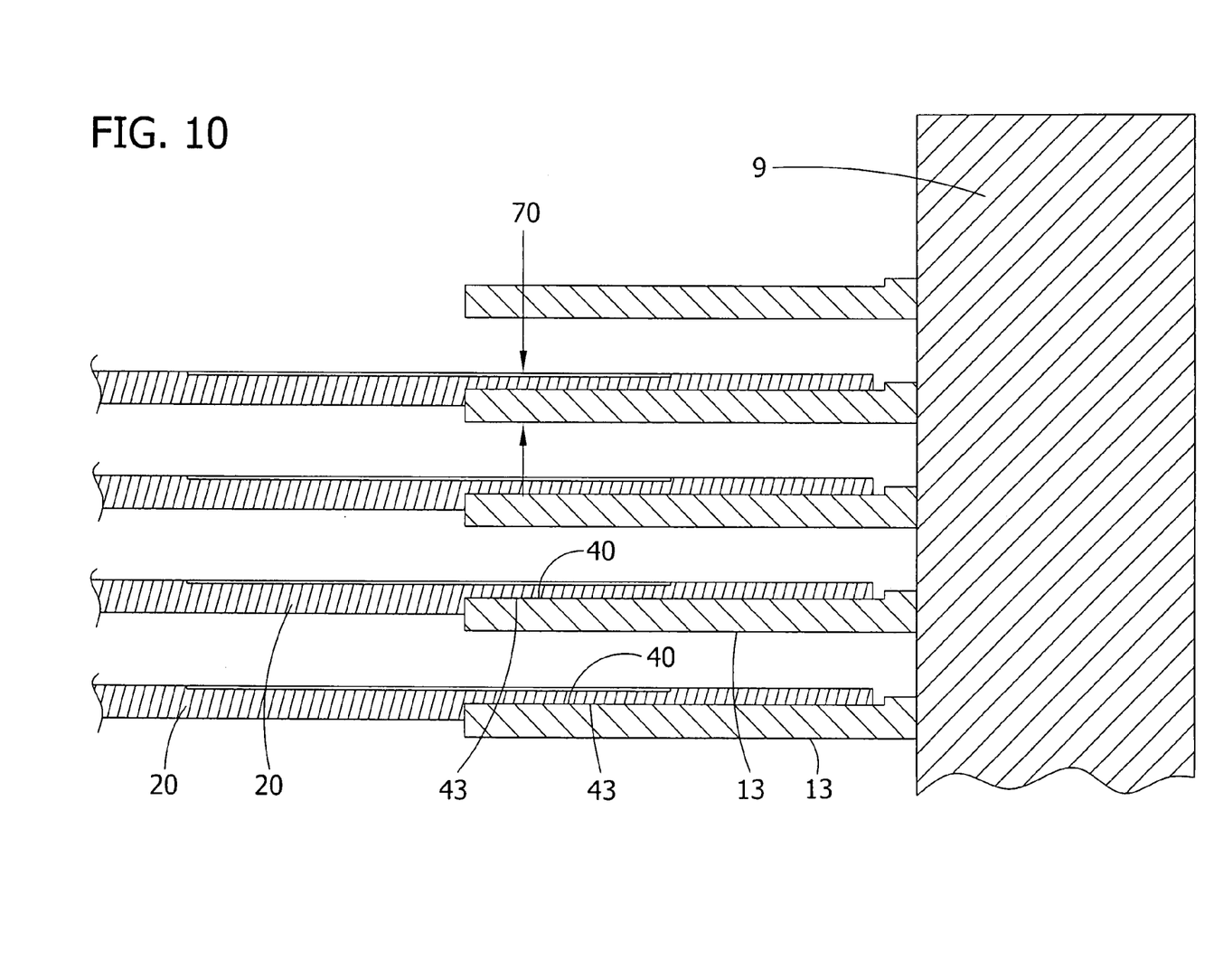
FIG. 10 is a fragmentary section similar to FIG. 4, but showing multiple fingers and platforms.
Figure 11:
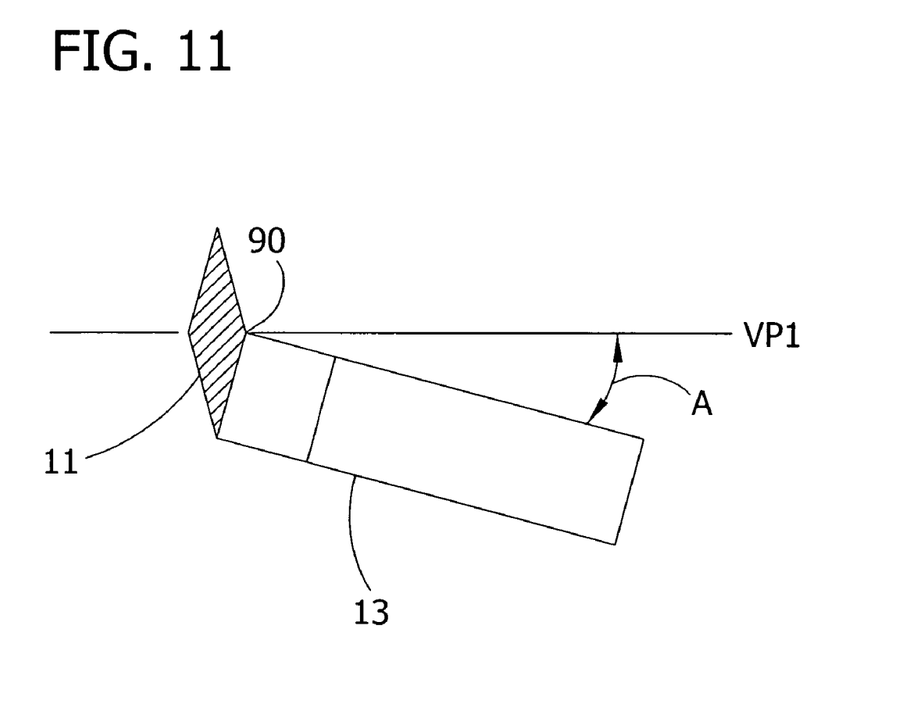
FIG. 11 is an enlarged plan view of an isolated finger extending from the left forward rod showing the angle at which the finger extends from the rod.

Referring particularly to FIGS. 9 and 10, when the wafer holder platforms 20 are resting on the fingers 13, there is a combined maximum thickness 70 at each support location 40, 43 of the fingers and the platforms that is less than the first overall maximum thickness 50 of each finger plus the first overall maximum thickness 53 of each wafer holder platform. In the illustrated embodiment, the combined maximum thickness at each support location 40, 43 is about 4.0 mm. The combined maximum thickness 70 at each support location 40, 43 leaves a vertical space 80 between the platform 20 and the fingers 13 just above the platform. The vertical space 80 allows a robotic arm to introduce and remove the wafer. In the illustrated embodiment, the vertical space 80 is about 3.8 mm.

As described above, the illustrated embodiment shows both the fingers 13 and wafer holder platforms 20 having second maximum thicknesses 53, 63 less than the respective first overall maximum thicknesses 50, 60. It is understood, however, that the fingers 13 may not have a second maximum thickness less than the first overall maximum thickness 50. That is, the thickness of each finger 13 may be substantially uniform along its length, and only the wafer holder platforms 20 have a second maximum thickness 63 which is less than the first maximum thickness 60. Alternatively, the wafer holder platforms 20 may not have a second maximum thickness less than the first overall maximum thickness 60. That is, the thickness of each wafer holder platform 20 may be substantially uniform along its length, and only the fingers 13 have a second maximum thickness 53 which is less than the first maximum thickness 50. It is noted that these embodiments are satisfactory for the intended purpose of the present invention as long as the combined maximum thickness 70 at each support location 40, 43 of the fingers 13 and wafer holder platforms 20 is less than the combined first maximum thicknesses 50, 60 of the fingers 13 and wafer holder platforms 20.

By reducing the thickness of each finger 13 and the thickness of each wafer holder platform 20 at the respective support locations 40, 43, as described above, the vertical space in the wafer boat 1 occupied by the combined thickness 70 of the each finger and each platform is reduced. This reduction in combined thickness 70 creates more open vertical space within the wafer boat 1, which in turn, can be used to add more fingers 13 and platforms 20. Increasing the number of platforms 20 increases the number of wafers that can be housed in the same vertical space within the wafer boat 1. Decreasing the vertical space occupied by the combined thickness 70 of each finger 13 and each wafer holder platform 20 at the respective support locations 40, 43 increases wafer throughput of the vertical furnace and production of heat-treated semiconductor wafers, while decreasing production costs. However, the combined thickness of each finger 13 and each wafer holder platform 20 at the respective support locations 40, 43 is sufficient to provide a stable foundation for holding the wafer so as to avoid slip and plastic deformation of the wafer during heat treatment.

The illustrated wafer boat 1 of the present invention can hold up to about 135 wafers or about 1.2 wafers per centimeter of height of the wafer boat. The overall height of the wafer boat 1 of the illustrated embodiment is such that it can fit within a quartz tube of an ASM® A412 vertical furnace. A wafer boat 1 constructed according to the teachings of the prior art typically holds less than 1 wafer per centimeter of height of the wafer boat. Thus, the wafer boat 1 of the present invention increases throughput by up to 50% without, as stated above, compromising wafer quality.

Referring to FIG. 3, points nearest to the central rod 9 (i.e., most rear points) where the forward rod fingers 13 and the forward rods 11 meet are designated 90. These points 90 are located in a forward vertical plane VP1 that is spaced forward from a parallel rear vertical plane VP2 that is tangent to the wafer boat 1 at the back of the boat. In the illustrated embodiment, the central rod 9 defines the back of the wafer boat 1. The optimal configuration of the support rods 3 and fingers 13 (i.e., the arrangement of the rods and fingers that would give the most support to the wafer holder platforms) is where the rods are spaced equidistantly apart forming an equilateral triangle arrangement and the fingers extend toward the center of the wafer holder platform 20. In this arrangement, the support of the fingers 13 is equally distributed along the circumference of the wafer holder platform 20. However, this optimal configuration is not feasible for use with 300 mm and larger diameter wafer boats because of dimensional constraints imposed by the diameter of the wafers to be received in the boat and the internal diameter of the vertical furnace. The distance between two support rods 3 must be greater than the diameter of the wafer, e.g., 300 mm, so that the wafer can be received within the boat (e.g., between the forward rods 11). Moreover, the cross-sectional diameter of the wafer boat 1 cannot be greater than the internal diameter of a quartz tube of the vertical furnace, or else the boat will not fit in the furnace. For example, the internal diameter of a quartz tube for the ASM® A412 vertical furnace is about 340 mm. Positioning the three support rods 3 at least 300 mm apart (since they are optimally in an equilateral triangle arrangement) makes the diameter of the wafer boat 1 much greater than the internal diameter of the quartz tube, and the boat would not fit in the furnace. It is noted that even if a larger diameter furnace were possible, an equilateral triangle arrangement of the support rods 3 would require very long fingers 13, resulting in a wafer boat with low mechanical stability because of the lengths of the fingers.

Because the support rods 3 cannot be equidistantly spaced apart, the prior art teaches the configuration of the forward rods 11 spaced apart the minimal distance necessary to allow the wafers to be received in the boat 1 (e.g., in the illustrated embodiment the distance is based on 300 mm wafers) and positioned in the forward vertical plane VP1 as far away from the rear vertical plane VP2 as possible without wafer boat exceeding its diameter constraint imposed by the internal diameter of the vertical furnace. The fingers 13 extending from the forward rods 11 also lie in the forward plane VP1. This configuration is an attempt to best distribute the support of the fingers 13 along the circumference of the wafer holder platform 20 while staying within the imposed constraints. However, this configuration may not adequately support the area of the wafer holder platform 20 forward of the forward plane VP1. Inadequate support of the wafer holder platform 20 forward of the forward rods 11 may cause plastic deformation of the wafer platform 20 (especially in the open ring type of the illustrated embodiment) leading to slip and possibly plastic deformation in the silicon wafers during high-temperature heat treatment in the vertical furnace.

Figure 12:
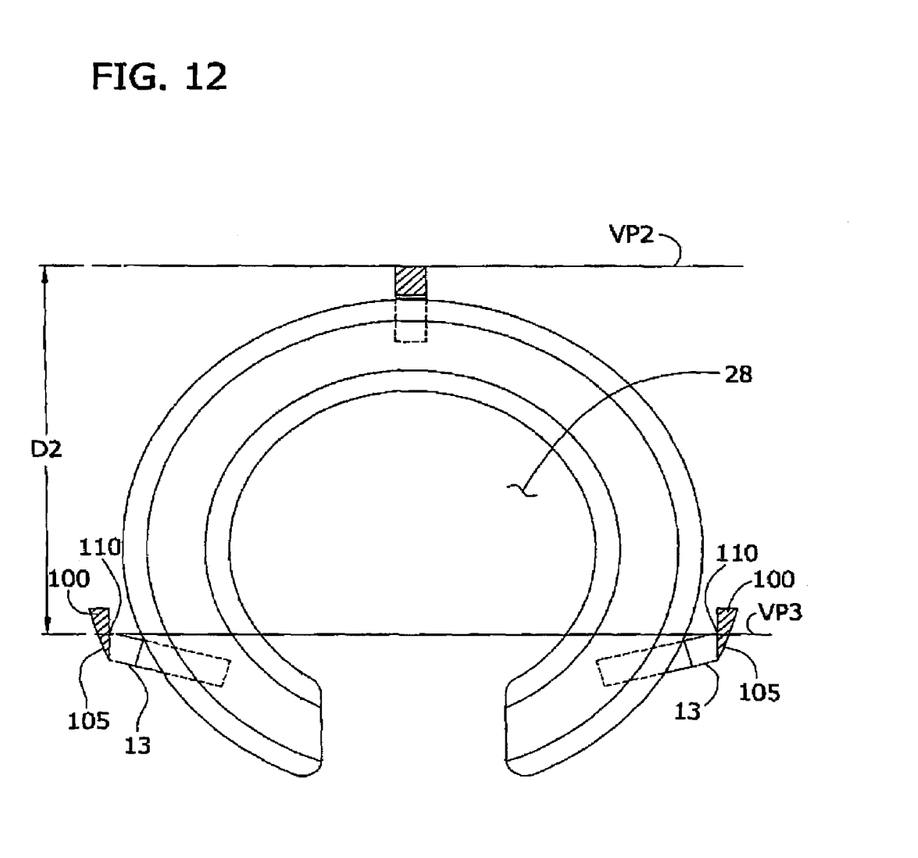
FIG. 12 is a horizontal cross-section of the wafer boat with another embodiment of the forward rods having wedge-shaped cross-sections.

In one embodiment of the wafer boat 1 of the present invention, the fingers 13 on the forward rods 11 are angled forward an angle A relative to the forward plane VP1 to allow the support locations 40 of the fingers to underlie portions of the areas of the wafer holder platforms 20 that are forward of the forward plane VP1 (FIG. 12). The angling of the fingers 13 on the forward rods 11, in effect, gives greater support to the forward part of the wafer holder platform 20 than would be given if the fingers extended along the forward plane VP1 (as in the prior art). In one embodiment, the angle A is between 10 and 20 degrees, and in the illustrated embodiment is about 15 degrees.

The fingers 13 on the forward rods 11 must typically be longer than the fingers on the central rod 9 because the forward rod fingers must extend to a more forward location nearer to the ideal, equilateral location for supporting the wafer holder platform 20. In the illustrated embodiment, a length L1 of each finger 13 of the forward rods 11 is about 60 mm (FIG. 4). Also in the illustrated embodiment, a length L2 of each finger 13 of the central rod 9 is about 28 mm (FIG. 5). Other lengths consistent with the teachings of the present invention are contemplated. As is well known in the art, during high-temperature heat treatment, increasing the lengths L1, L2 of the fingers 13 decreases their mechanical stability. This decrease in mechanical stability could lead to plastic deformation and inadequate support or even failure. The fingers 13 of the forward rods 11 have the lengths L1 so that they extend as far forward as possible without exceeding dimensional constraints for mechanical stability.

In use, the wafer boat 1 is readied by placing the wafer holder platforms 20 on the respective fingers 13. Wafers are loaded into the boat 1 so that each wafer is placed on the top surface 22 of one wafer holder platform 20. Typically, the wafers are loaded via a robotic arm, as is well known in the art. Once the boat 1 is loaded with a predetermined number of wafers (ranging from 1 wafer to about 135 wafers using the illustrated embodiment), the boat is received in the vertical furnace. The high-temperature heat treatment is performed, as is well known in the art. Space is provided between each wafer and the wafer holder platform 20 to receive a portion of the robotic arm. After heat treatment and other treatment, the wafers are unloaded from the boat 1, typically using the robotic arm.

In another embodiment of the present invention, illustrated in FIG. 12, the cross-sections of side support rods 100 are wedge-shaped. The side rods 100 each have a tapered cross-section where the cross-section of the rod tapers in the direction of the fingers 13. The outer surfaces 105 of the side rods curve toward the finger such that substantially the entireties of the outer surfaces lie on the circumference of the cross-section of the wafer boat 1. A forward vertical plane VP3 is defined by points 110 nearest to the central rod 9 (i.e., most rear points) where the forward rod fingers 13 and the forward rods 100 meet. This forward vertical plane VP3 is spaced apart a distance D2 from the rear vertical plane VP2. The forward vertical plane VP3 (i.e., the wedge-shaped rods 100) may be located even more forward from the rear vertical plane VP2 than the diamond-shaped rods 11 while staying within the internal diameter constraints of the quartz tube of the vertical furnace. In the illustrated embodiment, the distance D2 between the forward and rear planes VP3, VP2 is about 227 mm, or about 76% of the nominal diameter of the wafer.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions without departing from the scope of the invention, it is intended that all matter contained in the above description and shown in the accompanying drawing[s] shall be interpreted as illustrative and not in a limiting sense.

What is claimed is:

1. A wafer boat for use in heat treatment of semiconductor wafers in a vertical furnace, the wafer boat comprising:
   support rods disposed in fixed arrangement relative to each other and extending generally vertically when the wafer boat is placed in the vertical furnace;
   fingers supported by the support rods and extending from the rods, the fingers being arranged in groups lying generally in different common horizontal planes along the vertical extent of the support rods;
   wafer holder platforms each adapted to be supported by respective groups of fingers generally at different ones of said horizontal planes, the fingers being adapted to underlie the wafer holder platforms and support the platforms at support locations, the wafer holder platforms each being sized and shaped for receiving one of the semiconductor wafers thereon;
   the fingers and wafer holder platforms each having a respective first overall maximum thickness, each support location of at least one of the fingers and the wafer holder platforms having a second maximum thickness less than the first overall maximum thickness.

2. A wafer boat as set forth in claim 1 wherein each finger and wafer holder platform have a combined maximum thickness at the support location which is less than the first maximum overall thickness of the finger plus the first maximum overall thickness of the wafer holder platform.

3. A wafer boat as set forth in claim 2 wherein the combined maximum thickness of each finger and wafer holder platform at the support location is less than about 4 mm.

4. A wafer boat as set forth in claim 3 wherein the combined maximum thickness of each finger and wafer holder platform at the support location is about 3 mm.

5. A wafer boat as set forth in claim 2 wherein the support location of each finger is at a free end margin of the finger.

6. A wafer boat as set forth in claim 5 wherein each wafer holder platform has a groove therein sized and shaped for receiving the free end margin of one of the fingers, each wafer holder platform having the second maximum thickness in the groove.

7. A wafer boat as set forth in claim 2 wherein each wafer holder platform has a groove therein sized and shaped for receiving one of the fingers, each wafer holder platform having the second maximum thickness in the groove.

8. A wafer boat as set forth in claim 2 wherein the support rods include a central rod and two side rods, the two side rods being located in a vertical plane which is spaced forward of a parallel vertical plane tangent to the wafer boat a distance greater than 50% of a nominal diameter of the semiconductor wafers to be held in the wafer boat and less than about 85% of the nominal diameter of the semiconductor wafers.

9. A wafer boat as set forth in claim 8 wherein the vertical plane including the support rods is spaced from the parallel vertical plane tangent to the wafer boat a distance greater than 50% of a nominal diameter of the semiconductor wafers to be held in the wafer boat and less than about 80% of the nominal diameter of the semiconductor wafers.

10. A wafer boat as set forth in claim 8 wherein the fingers supported by the side rods are angled with respect to the vertical plane including the side rods.

11. A wafer boat as set forth in claim 10 wherein the fingers supported by the side rods are angled with respect to the vertical plane including the side rods in a direction away from the central rod.

12. A wafer boat as set forth in claim 11 wherein the fingers supported by the side rods are angled about 15° with respect to the vertical plane including the side rods.

13. A wafer boat as set forth in claim 8 wherein the side rods have tapered cross sections.

14. A wafer boat for use in heat treatment of semiconductor wafers having a nominal diameter in a vertical furnace, the wafer boat comprising:
   support rods disposed in fixed arrangement relative to each other and extending generally vertically when the wafer boat is place in the vertical furnace, the support rods including a pair of forward rods and at least one other rod;
   fingers supported by the support rods and extending from the rods, the fingers being arranged in groups lying generally in different common horizontal planes along the vertical extent of the support rods, the forward rods lying generally in a vertical plane, the fingers extending from the forward rods making an angle with the vertical plane of the forward rods;
   wafer holder platforms each adapted to be supported by respective groups of fingers generally at different ones of said horizontal planes, the fingers being adapted to underlie the wafer holder platforms and supporting the platforms at support locations, the wafer holder platforms each being sized and shaped for receiving one of the semiconductor wafers thereon;
   the two forward rods being located in a vertical plane which is spaced forward of a parallel vertical plane tangent to the wafer boat a distance greater than 50% of a nominal diameter of the semiconductor wafers to be held in the wafer boat and less than about 85% of the nominal diameter of the semiconductor wafers.

15. A wafer boat as set forth in claim 14 wherein the vertical plane including the forward rods is spaced from the parallel vertical plane tangent to the wafer boat a distance greater than 50% of a nominal diameter of the semiconductor wafers to be held in the wafer boat and less than about 80% of the nominal diameter of the semiconductor wafers.

16. A wafer boat as set forth in claim 15 wherein the forward rods have tapered cross sections.

17. A wafer boat as set forth in claim 14 wherein the fingers supported by the forward rods are angled with respect to the vertical plane including the forward rods in a direction away from the other rod.

18. A wafer boat as set forth in claim 17 wherein the fingers supported by the forward rods are angled about 150 with respect to the vertical plane including the forward rods.

19. A wafer boat as set forth in claim 14 wherein the fingers have a first thickness generally adjacent their intersection with the support rods, and a second, lesser thickness at free end portions of the fingers.

20. A wafer boat as set forth in claim 19 wherein the wafer platform support includes grooves adapted to receive the free end portions of the fingers.

* * * * *